(12) United States Patent
Matsutomo

(10) Patent No.: US 6,479,375 B2
(45) Date of Patent: Nov. 12, 2002

(54) METHOD OF FORMING A SEMICONDUCTOR DEVICE HAVING A NON-PEELING ELECTRODE PAD PORTION

(75) Inventor: Mitsuhiro Matsutomo, Kumamoto (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/874,265

(22) Filed: Jun. 6, 2001

(65) Prior Publication Data

US 2002/0009870 A1 Jan. 24, 2002

Related U.S. Application Data

(62) Division of application No. 09/176,192, filed on Oct. 21, 1993, now abandoned.

(30) Foreign Application Priority Data

Oct. 21, 1997 (JP) .............................................. 9-288705

(51) Int. Cl.$^7$ ............................................... H01L 21/44
(52) U.S. Cl. ....................... 438/612; 438/617; 438/672; 438/675; 438/688; 438/685; 438/637
(58) Field of Search ................................ 438/612, 617, 438/637–640, 672, 675, 685–688

(56) References Cited

U.S. PATENT DOCUMENTS

| | | | |
|---|---|---|---|
| 4,065,780 A | 12/1977 | Ballantyne | |
| 4,835,593 A | 5/1989 | Arnold et al. | |
| 5,171,712 A | * 12/1992 | Wang et al. | ................... 438/17 |
| 5,248,903 A | 9/1993 | Heim | |
| 5,262,353 A | * 11/1993 | Sun et al. | ................... 257/503 |
| 5,567,981 A | 10/1996 | Bhansali et al. | |
| 5,674,781 A | * 10/1997 | Huang et al. | ................ 438/626 |
| 5,773,890 A | 6/1998 | Uchiyama et al. | |
| 5,907,788 A | * 5/1999 | Kasai | ........................ 438/622 |
| 5,962,919 A | 10/1999 | Liang et al. | |
| 6,091,099 A | 7/2000 | Kiyotoshi et al. | |
| 6,093,964 A | 7/2000 | Saitoh | |

FOREIGN PATENT DOCUMENTS

| | | | |
|---|---|---|---|
| JP | 60-227483 | 11/1985 | |
| JP | 5-335370 | 12/1993 | |
| JP | 05347358 | * 12/1993 | ........... H01L/21/90 |
| JP | 08293523 | * 5/1996 | ........... H01L/21/60 |
| JP | 8-293523 | 11/1996 | |
| JP | 10-199925 | 7/1998 | |

OTHER PUBLICATIONS

Japanese Office Action dated Feb. 27, 2001, with partial English translation.

* cited by examiner

*Primary Examiner*—Tuan H. Nguyen
*Assistant Examiner*—Thanh Nguyen
(74) *Attorney, Agent, or Firm*—McGinn & Gibb, PLLC

(57) ABSTRACT

In a semiconductor device, each electrode pad portion is structured by a metal portion, such as a W film, buried in a recess of an oxide film and vertically extended and a pad film, such as an Al alloy film, partially contacted with the metal portion. An underlying film, such as a TiN film, underlies the pad film and the metal portion and is deposited on a conductive film, such as a Ti film, which is contacted with the oxide film and the recess of the oxide film. With this structure, peeling off can be avoided in the pad film, the underlying film, and the conductive film when a wiring line is bonded to the pad film.

15 Claims, 2 Drawing Sheets

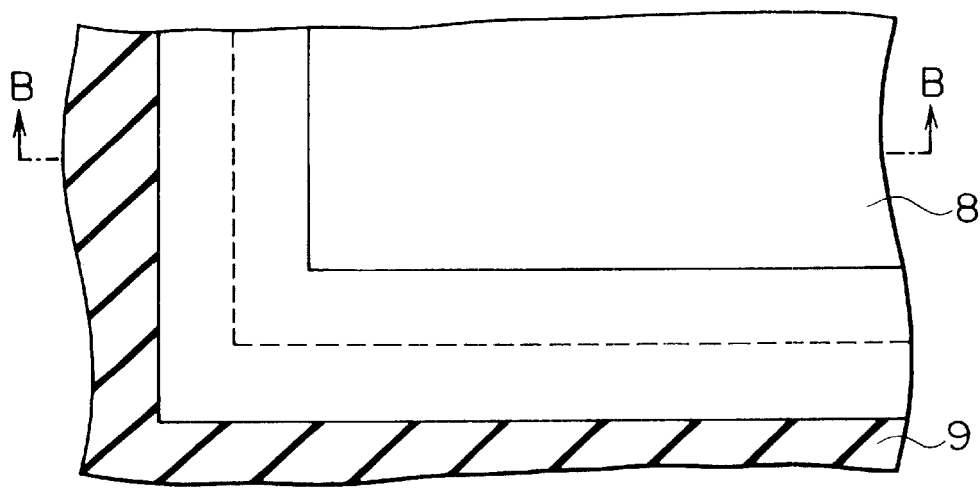
FIG. IA PRIOR ART
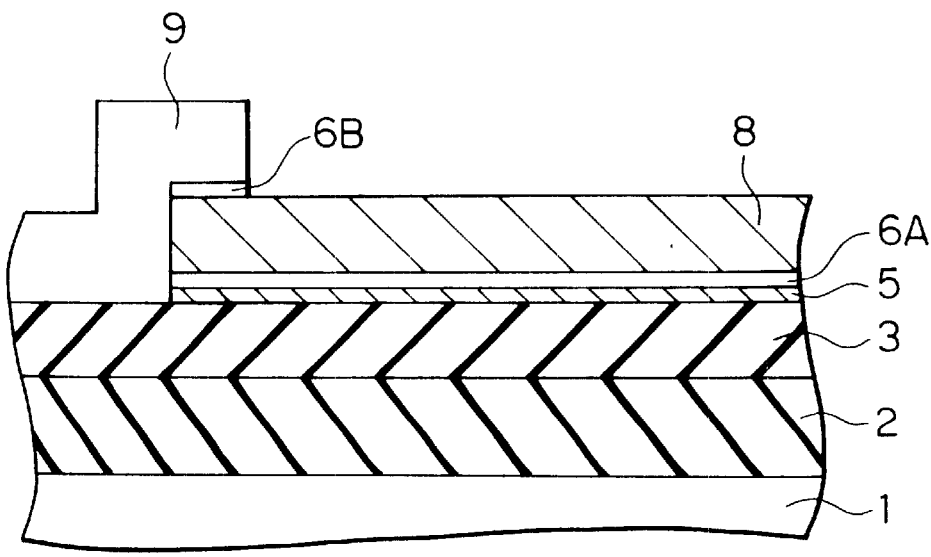
FIG. IB PRIOR ART

METHOD OF FORMING A SEMICONDUCTOR DEVICE HAVING A NON-PEELING ELECTRODE PAD PORTION

This application is a divisional of application Ser. No. 09/176,192, filed on Oct. 1, 1993 which was abandoned.

BACKGROUND OF THE INVENTION

This invention relates to a semiconductor device and, in particular, to an electrode pad structure in a semiconductor device.

Generally, a great number of electrode pads are arranged around a semiconductor chip to connect the semiconductor chip with inner leads of a lead frame by wiring. Such electrode pads themselves become small in size and thin in thickness with an increase of integration of the semiconductor chip and tend to be arranged with a very small pitch around the semiconductor chip.

Under the circumstances, each electrode pad is liable to come off the semiconductor chip on bonding a metal wire, such as a gold wire, onto each electrode pad. This is because the electrode pads are deposited on an insulating layer formed on a semiconductor substrate and adhesion is not always good between the insulating layer and the electrode pads when glass and aluminum are used to the insulating layer and the electrode pads, respectively.

Japanese Unexamined Patent Publications (JP-A) No. Syo 60-227483, namely, 227483/1985 proposes a method of manufacturing a solar cell so as to prevent an aluminum layer from being peeled off. To this end, the method includes the steps of making a surface of a substrate coarse and depositing a solder film on the coarse surface.

However, no consideration is made at all about electrode pads of a semiconductor device.

SUMMARY OF THE INVENTION

It is an object of this invention to provide a semiconductor device which is capable of preventing each electrode pad portion from coming off a semiconductor chip.

A semiconductor device to which the present invention is applicable has a semiconductor substrate and a pad electrode portion formed on the semiconductor substrate through an insulation film. The insulation film has recesses at the pad electrode portion. The pad electrode portion comprises metal films buried in the recesses and an electrode pad film which is contacted with the metal films and which covers the insulation film.

Thus, the electrode pad portion according to the present invention is formed on the recessed insulation film to widen a contact area between the electrode pad portion and the insulation film. The metal films or metal portions may be formed by a refractory metal, such as tungsten, molybdenum.

In addition, a laminate may be placed under the electrode pad film and the metal portions to be contacted with the insulation film and may comprise an underlying film of, for example, Ti, and an intermediate film of, for example, TiN between the underlying film and each of the electrode pad film and the metal portions. With this structure, it is possible to prevent the underlying film and the insulation film from being peeled off by stress due to ultrasonic vibration given on bonding. This is because the underlying film of, for example, Ti has a portion which is vertically extended towards the surface of the substrate and which serves to withstand horizontal stress which results on bonding from the ultrasonic vibration horizontally traveling.

BRIEF DESCRIPTION OF THE DRAWING

FIGS. 1A and 1B show a plan and a cross section of a conventional electrode pad, respectively.

DESCRIPTION OF THE PREFERRED EMBODIMENT

1. Prior Art

Figure 2A:
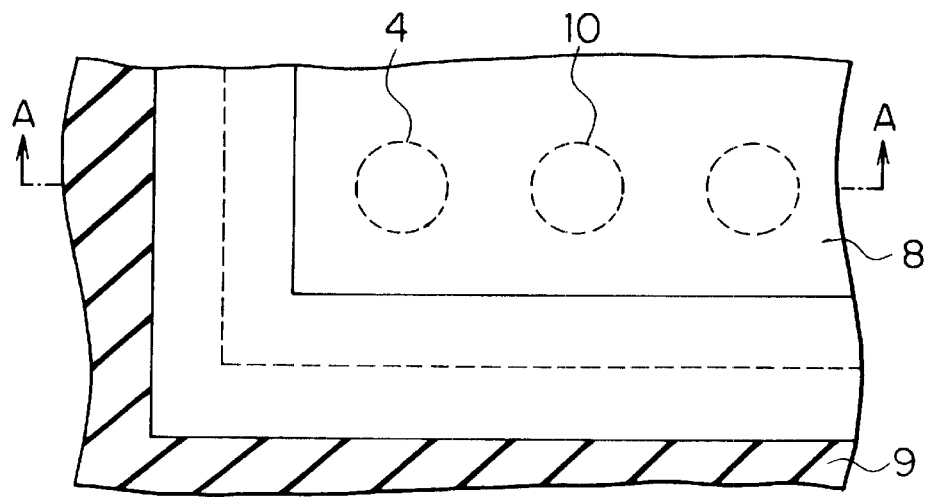
FIGS. 2A and 2B show a plan and a cross section of the electrode pad of this invention, respectively.

Referring to FIGS. 1A and 1B, description will be made about a conventional semiconductor device for a better understanding of this invention. As shown in FIGS. 1A and 1B, a single electrode pad portion or member alone is illustrated for brevity of description and is arranged on a semiconductor chip together with the other electrode pad portions (not shown). The electrode pad portions are connected to conductive lines wired on the semiconductor chip and are connected to inner leads of a lead frame (not shown also) through bonding wires or wiring lines. Such wiring lines are bonded onto the electrode pad members.

More specifically, the illustrated conventional electrode pad portion is structured by a semiconductor substrate 1, an underlying layer 2 of borophospho-silicate glass (BPSG), an oxide layer 3 on the underlying layer 2, and a laminate layer on the oxide layer 3. The laminate layer shown in FIGS. 1A and 1B is composed of a titanium (Ti) film 5 and a titanium nitride (TiN) film 6A, and an aluminum (Al) alloy film 8 and will be collectively referred to as a wiring layer because they serve as a conductor.

The laminate layer of the above-mentioned three films 5, 6A, and 8 is helpful to improve reliability on finely delineating the aluminum (Al) alloy film 8. Specifically, the titanium nitride film 6A is effective to improve adhesion between the aluminum alloy film 8 and the titanium film 5 which is operable as a barrier metal film. With this structure, the titanium nitride film 6A must therefore lie between the titanium film 5 and the aluminum alloy film 8.

However, the illustrated laminate layer is disadvantageous in that an oxide titanium alloy film of an extremely thin thickness tends to undesirably occur between the titanium (Ti) film 5 and the oxide film 3. Since such an undesirable oxide titanium alloy is fragile, peeling off often takes place on a boundary surface between the oxide film 3 and the titanium (Ti) film 5 due to stress imposed on wire-bonding to the electrode pad portion. Moreover, as the thickness of the aluminum (Al) alloy film 8 is thinner, the peeling off frequently happens because the stress on bonding becomes strong as the aluminum (Al) alloy film becomes thin.

In addition, the peeling off on the boundary between the oxide film 3 and the titanium (Ti) film 5 also results in peeling off the aluminum (Al) alloy film 8, which will be called Al peeling off hereinafter.

Large capacity of recent semiconductor chips makes the width of the aluminum wires narrow and their thickness thin. Consequently, as the electrode pad portion become thinner and thinner, the risk of peeling off on bonding becomes higher, as mentioned in the preamble of the instant specification.

2. Experimental Studies

The present invention is based on the fact that on bonding, Al peeling off is caused to occur due to ultrasonic vibration which is imposed on bonding and which concentrates on a local position or spot. In addition, it has been found out that a boundary surface between the titanium film and the oxide film becomes fragile when the aluminum (Al) alloy film is deposited and that such Al peeling off mainly stems from the fragility on the boundary surface between the titanium film and the oxide film.

Herein, it is to be noted that the stress by ultrasonic vibration can be readily absorbed in an Al alloy film and, therefore, no problem takes place in connection with the Al peeling off, when the Al alloy film has a relatively large thickness of, for example, 1 μm or more. However, a recent Al alloy film becomes thinner than the above-mentioned thickness and stress due to ultrasonic vibration travels easily to the boundary between the oxide film and the titanium film. As a result, Al peeling off is often caused to occur as mentioned before and gives rise to a serious problem.

Furthermore, local concentration of a ultrasonic vibration is promoted by a reduction of each size of bonding balls which results from a reduction of each size of the electrode pads.

According to the inventors experimental studies, it often happened that the peeling off was caused to internally occur on the boundary surface between the titanium film and the oxide film even when no Al peeling was observed on the aluminum alloy film. Such internal peeling off is liable to weaken reduce bonding strength and results in a reduction of reliability against stress imposed by customer sides.

3. Embodiment

Figure 2B:
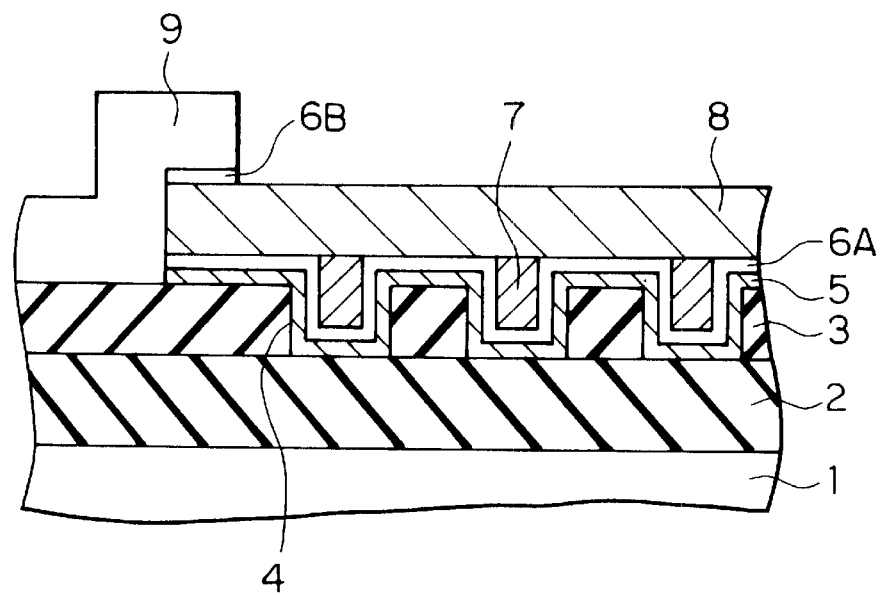

Referring to FIGS. 2A and 2B, description will be made as regards a semiconductor device according to an embodiment of the present invention.

As shown in FIGS. 2A and 2B, the semiconductor device is specified by a single electrode pad portion and has a semiconductor substrate 1 and an underlying layer 2 of borophospho-silicate glass (BPSG) coated on the semiconductor substrate 1, like in FIG. 1.

The illustrated electrode pad portion is structured by an oxide film 3 which is formed on the semiconductor substrate 1 and which has a thickness of about 1 μm. As shown in FIG. 2B, the illustrated oxide film 3 is selectively removed or etched to form a plurality of grooves or recesses 4 each of which has a diameter of 0.8 μm. In this situation, the underlying layer 2 is partially exposed through the recesses 4. On the oxide film 3 and the recesses 4, a titanium (Ti) film 5 of about 30 nm thick is deposited and is covered with a titanium nitride (TiN) film 6A of about 100 nm thick. As readily understood from FIG. 2B, recessed portions are left on the TiN film 6A at positions corresponding to the recesses 4 of the oxide film 3.

A tungsten (W) film 7 is buried in the recessed portions of the TiN film 6A and provides a flat surface together with the TiN film 6A, as shown in FIG. 2B. Thereafter, an Al alloy film 8 is deposited to a thickness of about 600 μm on the flat surface formed by the TiN film 6A and the W film 7.

In the embodiment illustrated in FIG. 2B, a TiN film 6B is partially deposited on the Al alloy film 8 as an antireflection film while a passivation film 9 of, for example, phosphosilicate glasses (PSG) is coated on the TiN film 6B and the oxide film 3.

In the above mentioned embodiment, no Al peeling off has been found out on wire bonding by the use of a ultrasonic wave. This is because the electrode pad portion is also contacted not only with the TiN film 6A but also with metal layers, such as the W film 7, formed on the recesses 4.

Referring FIGS. 2A and 2B again, description will be made about a practical electrode pad portion. In the electrode pad portion shown in FIGS. 2A and 2B, metal layers, such as the W films 7, are partially formed on the oxide film 3 and have a diameter of about 0.8 μm and a depth of about 1 μm. In the example illustrated, the Ti film 5 is about 30 nm in thickness while the TiN film 6A is about 100 nm in thickness. The Ti film 5 and the TiN film 6A are deposited together with the W film 7 by the use of sputtering, CVD (chemical vapor deposited), or the like. Finally, the Al alloy film 8 is deposited on the metal layers 10 and the TiN film 6A to a thickness of about 600 nm. Thus, the practical electrode pad portion is manufactured on the semiconductor chip. Although only one electrode pad portion is illustrated in FIGS. 2A and 2B, a great number of electrode pad portions are practically simultaneously formed on the semiconductor chip.

Next, description will be made with reference to FIGS. 2A and 2B about a method of manufacturing each electrode pad portion more in detail. First, provision is made of the semiconductor substrate 1 which has a principal surface upwards of FIG. 2A. The underlying film 2 of BPSG and the oxide film 3 are successively formed on the principal surface of the semiconductor substrate 1. In this event, the underlying layer 2 serves as an interlayer insulation layer.

The oxide film 3 is thereafter selectively etched by using a patterning technique and a dry etching technique to form the recesses 4 within the oxide film 3. Subsequently, the Ti film 5 and the TiN film 6A are successively deposited by sputtering or the like on the oxide film 3 and the recesses 4. In this state, the W film 7 is deposited on both the TiN film 6A and the recessed portions of the TiN film 6A.

Next, the W film is etched back to be removed from the TiN film 6A with the W film 7 left in the recessed portions of the TiN film 6A. Thereafter, the Al alloy layer 8 is deposited on the TiN film 6A and the W film 7 by sputtering and is subjected to patterning and etching to provide the electrode pad portions and the aluminum wiring pattern.

Herein, it is to be noted here that a recent semiconductor chip often has a multi-layer interconnection structure and the partial metal layers illustrated in FIGS. 2A and 2B can be formed simultaneously with formation of via holes for interconnection between front and back wiring lines. This shows that the illustrated structure can be manufactured without increasing the number of processes necessary for the illustrated semiconductor device. The metal buried in the recesses 4 may be, for example, tungsten (W), molybdenum (Mo), or the like and may be identical with the metal buried in the via holes.

As mentioned above, the electrode pad portion according to this invention includes the Ti film 5 which has portions vertically extended towards the semiconductor substrate 1 like spikes. With this structure, the boundary surface or a contact surface between the Ti film 5 and the oxide film 3 is widened in its area.

In addition, the illustrated structure is strong against the stress which is caused to occur due to the ultrasonic vibration on bonding and can prevent the Al alloy layer 8 and the boundary surface from being peeled off. This is because the ultrasonic vibration is horizontally given along the Al alloy layer 8 while the Ti film 5 has the portion vertically extended relative to the Al alloy layer 8.

The W films 7, namely, buried metal portions are surrounded and fixed by side surfaces of the oxide film 3. This structure is helpful to prevent the Al alloy layer 8 from being peeled off even when tiny exfoliation takes place between the Ti film 5 and the oxide film 3.

At any rate, the contact surface between the Ti film 5 and the oxide film 3 is enlarged and the electrode pad portion gains high tolerance against the stress of ultrasonic vibration given on bonding. Consequently, on bonding a wiring line to the Al alloy layer 8, the electrode pad portion enables to avoid any peeling off phenomenon between the Ti film and the oxide film and on the Al alloy layer 8. This shows that the tolerance against the bonding becomes large. As the result, the present invention can provide a semiconductor device with high reliability.

Although the above description of the embodiment has thus far been made on the assumption that each of the recesses 4 has a circular configuration in section (as illustrated in FIG. 2A), this invention is not limited to the circular configuration. For example, each recess 4 may have a square configuration or the like.

What is claimed is:

1. A method of manufacturing a semiconductor device, comprising:

forming first and second insulation films on a semiconductor substrate;

forming a plurality of recesses in said second insulation film;

forming a plurality of metal films in said plurality of recesses and on an upper surface of said second insulation film, said plurality of metal films contacting said first insulation film through said plurality of recesses; and depositing at least one electrode pad film on said plurality of metal films.

2. The method as claimed in claim 1, wherein said plurality of metal films comprises a laminate film formed continuously in said recesses an on an upper surface of said second insulation film, and metal plugs formed on said laminate film in said recesses.

3. The method according to claim 2, further comprising:

planarizing an upper surface of said metal plugs and said laminate film.

4. The method according to claim 2, wherein said electrode pad film bonds to said metal plugs and said laminate film.

5. The method as claimed in claim 1, wherein each of the recesses has a circular configuration.

6. The method as claimed in claim 1, wherein each of the recesses has a rectangular shape.

7. The method as claimed in claim 1, wherein said metal films comprise refractory metals.

8. The method as claimed in claim 1, wherein said metal films comprises a same metal as metal films buried in via holes of said semiconductor device.

9. The method according to claim 1, wherein a thickness of said electrode pad film is 600 $\mu$m or less.

10. The method according to claim 1, wherein said first insulating film comprises a borophosphosilicate glass layer formed between said substrate and said insulation film.

11. The method according to claim 1, wherein said metal films comprise at least one of aluminum, titanium, tungsten and molybdenum.

12. The method according to claim 1, wherein each recess in said plurality of recesses has a diameter of about 0.8 $\mu$m.

13. The method according to claim 1, wherein each recess in said plurality of recesses comprises an opening which extends entirely through said insulation layer.

14. A method of manufacturing a semiconductor device, comprising:

forming first and second insulation films on a substrate;

forming at least one recess in said second insulation film;

forming a plurality of metal films in said at least one recess and on an upper surface of said second insulation film, said plurality of metal films contacting said first insulation film through said recesses; and forming an electrode pad on said plurality of metal films.

15. A method of manufacturing a semiconductor device, comprising:

forming first and second insulation films on a substrate, said second insulating film having a plurality of recesses;

forming a plurality of metal films on said second insulation film and in said recesses, said plurality of metal films comprising a laminate film which contacts said first insulation film through said recesses, and metal plugs formed on said laminate film in said recesses; and forming an electrode pad film on said plurality of metal films, said electrode pad film bonding to said metal plugs and said laminate film.

* * * * *